United States Patent [19]
Stolk

[11] Patent Number: 6,063,445
[45] Date of Patent: May 16, 2000

[54] METHOD OF PREPARATION OF POLYMER SUBSTRATES FOR METAL PLATING

[75] Inventor: Richard D. Stolk, Chesterfield, Mo.

[73] Assignee: McDonnell Douglas Corporation, St. Louis, Mo.

[21] Appl. No.: 09/134,983

[22] Filed: Aug. 17, 1998

[51] Int. Cl.⁷ ...................................................... B05D 3/04
[52] U.S. Cl. ........................................... 427/306; 427/307
[58] Field of Search .................................. 427/306, 307, 427/304, 96, 98, 437, 443.1

[56] References Cited

U.S. PATENT DOCUMENTS

| | | |
|---|---|---|
| 3,445,624 | 5/1969 | Sunnen . |
| 3,698,055 | 10/1972 | Holtz, Jr. et al. . |
| 4,002,507 | 1/1977 | Radeloff et al. . |
| 4,054,530 | 10/1977 | Deffeyes . |
| 4,150,981 | 4/1979 | O'Handley . |
| 4,315,045 | 2/1982 | Dillard et al. ........................... 427/307 |
| 4,381,943 | 5/1983 | Dickson et al. . |
| 4,661,216 | 4/1987 | Anderson et al. . |
| 4,761,327 | 8/1988 | Hamano et al. . |
| 4,780,781 | 10/1988 | Sano et al. . |
| 4,820,553 | 4/1989 | Sopchak et al. ......................... 427/304 |
| 4,857,143 | 8/1989 | Glenning et al. ........................ 156/668 |
| 4,959,121 | 9/1990 | Dumas et al. ........................... 156/668 |
| 5,015,517 | 5/1991 | Walsh ..................................... 428/156 |
| 5,198,096 | 3/1993 | Foust et al. ............................. 205/210 |
| 5,441,770 | 8/1995 | Rychwalski et al. .................... 427/306 |

*Primary Examiner*—Brian K. Talbot
*Attorney, Agent, or Firm*—Westerlund & Powell, P.C.; Robert A. Westerlund; Ramon R. Hoch

[57] ABSTRACT

Extremely thin polymer film substrates are conditioned for subsequent electroless plating by contact with a mild caustic solution. Aqueous solutions of about ½ wt % NaOH or KOH can successfully condition polyimide films with contact times of less than an hour. The more robust PET polymer films benefit from the addition of a permanganate salt to the solution to accelerate the conditioning process. Since these films are so thin, less than 1 mil, significant loss of polymer is not necessarily desirable. This process is designed to roughen the surface of the polymer film and render it hydrophilic to enhance the effectiveness of the subsequent electroless metal film deposition.

20 Claims, 5 Drawing Sheets

FIG. 1B

| 0.30 MIL APICAL (POLYIMIDE FILM) | | | | | | | |
|---|---|---|---|---|---|---|---|
| TIME OF EXPOSURE TO CAUSTIC AND DEA | | 2.5% CAUSTIC W/ NO G/L DEA | | | 10% CAUSTIC W/ 20 G/L DEA | 2.5% CAUSTIC W/ 20 G/L DEA | |
| MINUTES | | THICK (A) | LOSS TAN | THICK (A) | LOSS TAN | THICK (A) | LOSS TAN |
| 0 | | | 0.0000 | | 0.0000 | | 0.0000 |
| 5 | | 30600 | 0.2460 | 28580 | 0.2500 | 28200 | 0.2548 |
| 10 | | | | 32700 | 0.2475 | 30840 | 0.2154 |
| 20 | | 30840 | 0.2378 | 32600 | 0.2190 | 31000 | 0.2524 |
| 30 | | | | 34330 | 0.2557 | 31000 | 0.2513 |

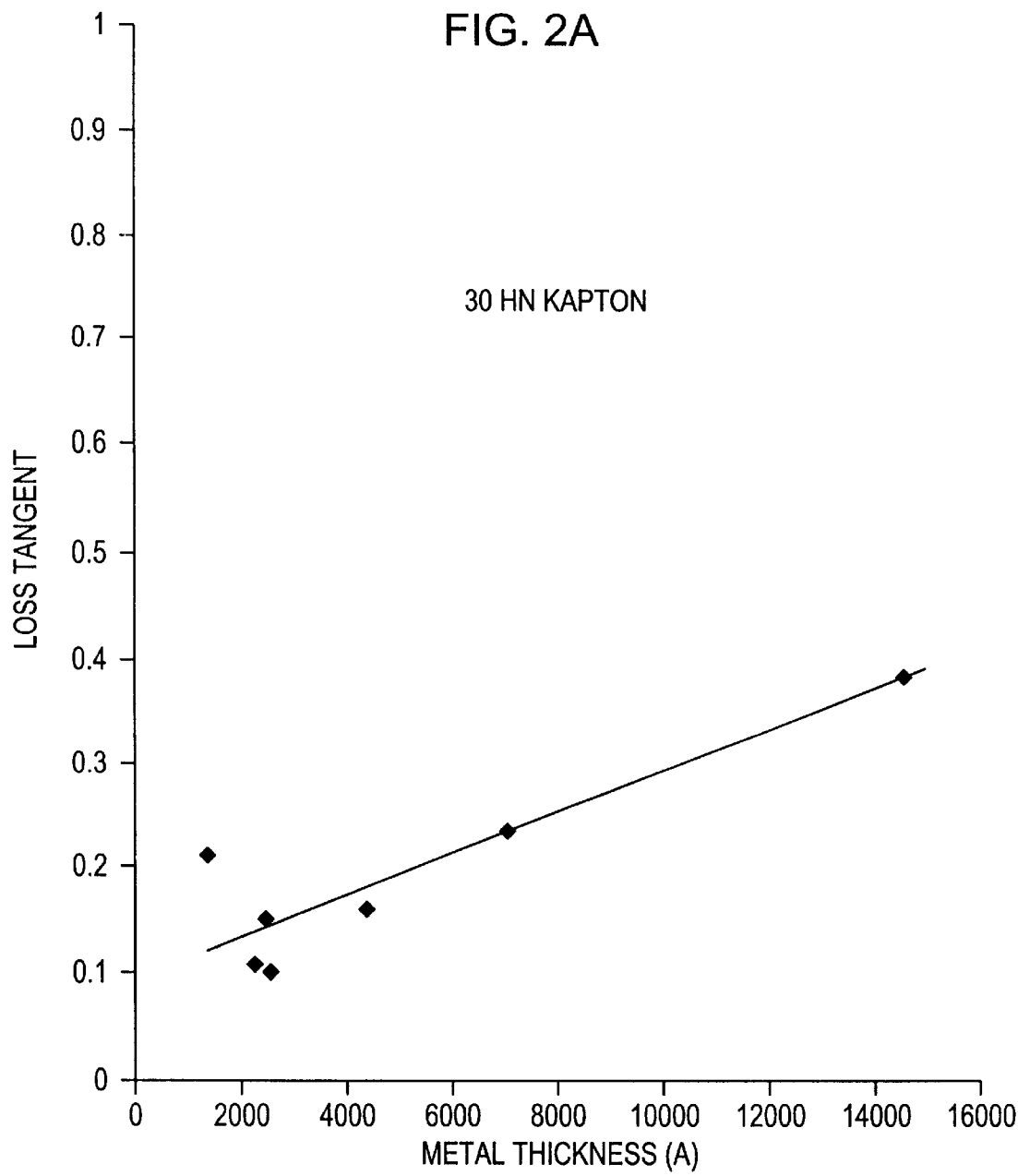

FIG. 3B

| | COMPARISON OF LOSS TANGENT OF FILMS | | | |
|---|---|---|---|---|
| | 0.12 MIL MYLAR | | | |
| | METAL (A) | LOSS TANGENT | | |
| | 2500 | 0.10 | | |
| | 4400 | 0.04 | | |
| | 5900 | 0.16 | | |
| | 6000 | 0.10 | | |
| | 7600 | 0.12 | | |
| | 7900 | 0.23 | | |
| | 11100 | 0.24 | | |
| | 12300 | 0.32 | | |
| | 14000 | 0.29 | | |
| | 15600 | 0.39 | | |
| | 16500 | 0.36 | | |
| | 0.32 MIL MYLAR | | | |
| | METAL (A) | LOSS TANGENT | | |
| | 900 | 0.10 | | |
| | 1800 | 0.18 | | |
| | 2300 | 0.11 | | |
| | 5800 | 0.21 | | |
| | 12300 | 0.31 | | |
| | 13300 | 0.32 | | |
| | DIFFERENT GAGES OF MYLAR | | | |
| | GAGE OF FILM | METAL THICKNESS (A) | LOSS TANGENT | |
| | 20C (0.20 MIL) MYLAR | 14650.00 | 0.38 | |
| | 32C (0.32 MIL) MYLAR | 14425.00 | 0.45 | |
| | 75D (0.75 MIL) MYLAR | 14380.00 | 0.29 | |
| | AVERAGE | 14485.00 | | |
| | 10C (0.10 MIL) MYLAR | 21150.00 | 0.78 | |
| | 20C (0.20 MIL) MYLAR | 22080.00 | 0.52 | |
| | 32C (0.32 MIL) MYLAR | 20220.00 | 0.50 | |
| | 75D (0.75 MIL) MYLAR | 19560.00 | 0.42 | |
| | AVERAGE | 20752.50 | | |
| | | | 20752.5 | 14485.00 |
| | 10C (0.10 MIL) MYLAR | 10 | 0.78 | |
| | 20C (0.20 MIL) MYLAR | 20 | 0.52 | 0.38 |
| | 32C (0.32 MIL) MYLAR | 32 | 0.50 | 0.45 |
| | 75D (0.75 MIL) MYLAR | 75 | 0.42 | 0.29 |

METHOD OF PREPARATION OF POLYMER SUBSTRATES FOR METAL PLATING

BACKGROUND OF THE INVENTION

The present invention relates to conditioning processes for preparing polymer surfaces for subsequent metal plating through electroless deposition processes. More particularly, this invention relates to such processes as applied to extremely thin substrates, less than about 1 mil in thickness, particularly for polyimide and polyester films.

This invention has particular utility in the field of electroless plating. Generally speaking, electroless plating requires a so-called activation or catalyzation step during which a substrate surface, to be electrolessly plated with a metal, has placed thereon a material, usually a metal salt. This metal salt is capable of reducing the plated metal from an electroless bath without the use of an electric current. Catalyzation by such a material (called a "catalyst" or an "activator") is referred to as such because the materials used, usually the salts of the precious metals (palladium, platinum, gold, silver, etc.) serve as reduction catalysts in an autocatalytic electroless plating process. Given a suitable surface for electroless deposition, an experienced practitioner can produce a smooth metal layer upon the substrate having good adhesion with little if any difficulty using widely available standard processing solutions.

Even though significant progress has been made in the art of plating metals on plastics, the adhesion between the coating and the plastic still leaves much to be desired. Poor adhesion between the plastic and the metal plated thereon allows differential dimensional changes with temperature and stress caused by a sub-optimum composition of the plating bath solution, either of which may result in warping, blistering, and cracking of the metallized product. Consequently, strong adhesion between a plastic substrate and the plated metallic layer is essential for any application in which the product is subjected to significant temperature fluctuations and subsequent mechanical processing.

Plastics show a relatively poor affinity for metal, and, to promote a stronger bond between a plastic substrate and a metallic coating, the prior art frequently resorted to roughening the plastic surface to provide locking or keying between the surface and its coating. The surface of the plastic substrate is normally relatively glossy and quite hydrophobic. Consequently, this surface is unreceptive to aqueous solutions used in electroless metal deposition. Since the sensitizing and activating solutions used for electroless plating will not wet the surface, the metal ions are not adsorbed onto the surface and deposition of the metal cannot proceed.

Roughening the surface of the hydrophilic substrate by mechanical means has been common practice in plating plastic materials. The first techniques used to this end were accomplished by some sort of mechanical deglazing, such as scrubbing with an abrasive slurry, dry rolling or abrasive (sand) blasting. This left a rough surface with significant topographic deviations from the prior planar surface, in turn requiring a relatively thick metal plating layer to return the object to a smooth surface condition. Clearly, this technique could not be used for thin substrates.

Roughening can also be accomplished by chemical means. Caustic and acidic etch solutions and solvents have been employed, depending upon the polymer composition. These acidic etch solutions commonly used sulfuric acid and chromate salts, mainly for polyesters but not polyimides. It should also be noted that acid-chromate etch solutions are not desirable from the environmental standpoint, due to the expensive requirement of removing the chrome and chromate ions from the spent solutions.

It was also discovered that preceding the acidic etch step with a caustic bath would improve the adhesion of the metal in subsequent steps. However, the etching removes a portion of the substrate surface and can result in an uneven surface, and its use is suspect when a thin substrate film is to be used. The acid pH is associated with the $Pd^{++}$ bath which uses HCl to solubilize the Pd metal. Also an acid rinse may be used after the caustic etch to quench the reaction.

Weight is always a concern for anyone developing equipment which is to be used as a component on aircraft, spacecraft or portable equipment such as laptop computers and cellular telephones. The plastic substrates used for printed circuits in such components are one area in which further weight reductions could be realized if there were a process available that could condition these thin substrates (less than 1 mil in thickness-0.001 inch) successfully. Heretofore no such process has been known to exist. Present conditioning techniques are limited in their application to substrates greater than 1 mil in thickness due to the harshness of the chemical solutions and the high reaction rates caused by high processing temperatures. Although these potential substrates are offered by their various manufacturers at extremely thin thickness', i.e. Mylar® (a polyethylene terephthalate-PET) is available in thickness' down to 0.00006 inch and Kapton® (a polyimide) is available down to 0.0003 inch, there is no known method of effectively conditioning these very thin substrates for subsequent electroless metal deposition.

Suppliers of these films suggest the use of shorter exposure for thinner substrates in caustic baths operating at higher temperatures, i.e. 5–10 minutes in a 50–70° C. bath. However, the polycrystalline nature of these thin films (30–35% crystalline/65–70% amorphous) leads to a non-uniform activation and subsequent imperfect metallization. It is postulated that the amorphous portions of the polymer are more aggressively attacked by the caustic.

U.S. Pat. No. 5,441,770 teaches the use of an aqueous solution of 25–60 wt % inorganic hydroxide (NaOH or KOH)+a wetting agent (about 1% of the total)+organic hydroxide (glycol or alcohol at less than 20% of the total), followed by use of an etchant solution of potassium or sodium permanganate (0.1–0.5 Molar), followed by neutralization by a hydrogen peroxide solution for conditioning of a polyimide substrate. These steps are conducted at 75–90° C. This process is much too harsh for use on the very thin substrates contemplated herein.

U.S. Pat. No. 5,015,517 discloses the use of a conditioning/etching mixture of KOH (15–40 wt %), a diamine (3–15 wt %) and alcohol (10–50 wt %) to surface treat a polyimide substrate. U.S. Pat. No. 4,820,553 discloses the treatment of PET and polyamides with an aqueous mixture of a source of hydroxyl ions (typically KOH at 20 wt %) and a water soluble organic solvent (preferably methanol at 33–50 wt % of the solution). Here again the high concentrations of the hydroxyl ions render these solutions unsuitable for use on the very thin substrates contemplated herein.

Based on the above and foregoing, it can be appreciated that there presently exists a need in the art for a method capable of providing a properly conditioned very thin polymer substrate for subsequent electroless metal deposition, which overcomes the above-described drawbacks and shortcomings of the presently available technology. The present invention fulfills these needs in the art.

SUMMARY OF THE INVENTION

The present invention encompasses a method for conditioning polymer substrates of less than 1 mil in thickness for electroless metal deposition. In the case of polyimide substrates, treatment of the substrate in a solution at ambient temperature comprising about 1 wt % of a metallic hydroxide such as NaOH or KOH for less than one hour will provide a properly conditioned surface. If the polyimide has been thermally cured at high temperature, the concentration of the metal hydroxide (1–2%) and time of processing (two to three times the routine approximate 20 minute period) are increased as needed. In the case of polyester terephthalates, a permanganate salt is added to a more concentrated caustic solution, and the processing temperature is raised from ambient (as used for polyimides) to about 85° C. After the single caustic etch step, no other preparation steps are taken prior to the initiation of the conventional activation steps used in electroless plating. This is in distinct contrast to the multi-step regimens taught in the prior art for the thicker film substrates and bulk plastic applications.

The present method provides a subtle processing methodology that is appropriate for use on the very thin substrates utilized herein and creates an opportunity for significant weight savings in a variety of different applications.

BRIEF DESCRIPTION OF THE DRAWINGS

These and various other features and advantages of the present invention will be readily understood with reference to the following detailed description taken in conjunction with the accompanying drawings, in which:

FIG. 1B is a table of the data used to generate the graph of FIG. 1A.

FIG. 2A is a graph showing the variation in loss tangent for a 30 HN Kapton film as a function of the metal thickness on the film.

FIG. 2B is a table of the data used to generate the graph of FIG. 2A.

FIG. 3B is a table of the data used to generate the graph of FIG. 3A.

DETAILED DESCRIPTION OF THE PREFERRED EMBODIMENT

Figure 1A:
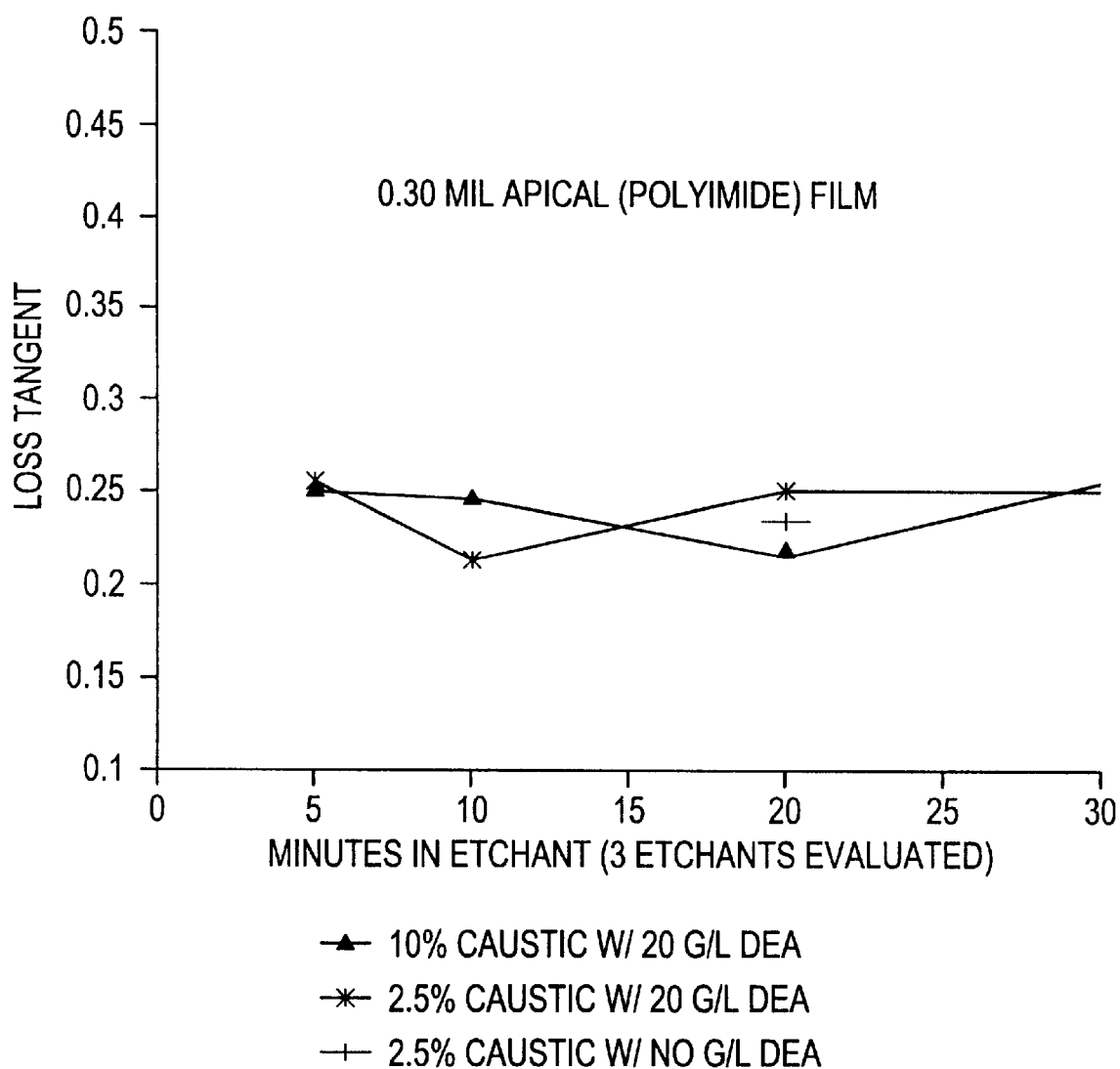
FIG. 1A is a graph showing the variation in loss tangent for a 0.30 mil Apical film (polyimide) as a function of minutes in etchant for three different caustic mixtures.

The present invention provides for a method for conditioning very thin, less than 1 mil in thickness, polymeric film substrates for subsequent electroless metal deposition. The method is particularly suited for polymer substrates composed of either polyimide or polyester materials, it is anticipated that it will find utility for use with other polymer substrates as well.

The basic conditioning bath comprises about a 1% aqueous solution of a metal hydroxide, preferably NaOH or KOH, although the other metal hydroxides will also perform satisfactorily. The polyimide films can be divided into two categories: those that are chemically cured (Kapton®) and those that are heat cured (Apical®-cured at 600° C.). These differences in curing require adjustment of the concentration of the metal hydroxide and treatment time as is shown in the following examples. In general, with both one can use the same caustic concentration of about 1–2% NaOH. With Kapton, one etches for about 20 minutes followed by a room temperature rinse. For Apical, one may etch for 40–45 minutes followed by a room temperature rinse.

The polyester terephthalates have a more resistant chemistry and require the addition of a controlled amount of a powerful oxidizer, preferably potassium permanganate, to render the surface of the substrate hydrophilic. It is also necessary to conduct the conditioning treatment at a higher temperature, preferably about 85° C. for Mylar®, for about 20 minutes. An exemplary solution would comprise 50–60 g/liter of potassium permanganate and 200 g/liter of sodium hydroxide.

In the case of polyimide films it is important to understand that overly prolonged contact with the conditioning bath (or at elevated temperatures or high hydroxyl concentrations) can result in the excessive formation of a gel-like material on the surface of the substrate. This is because a greater degree of dissolution of the polymer occurs, and a sodium salt of polyamic acid (precursor of the polyimide) is formed, leaving the gel-like layer on the surface of the substrate. If this layer is too thick, the layer will lose adhesion to the substrate. Since the colloidal activation palladium-tin chemicals become trapped in this layer, they will then be lost from the substrate when the poorly adhered layer breaks away from the substrate. Without the activation chemicals being bound to the surface of the substrate, the electroless plating will fail in the subsequent steps.

Although the present process is distinguished from the prior art processes for thicker substrates by its rejection of the harsh concentrations and high temperatures employed therein which aggressively etch into these thick substrates, it should be appreciated that a minor amount of etching will occur even with the present process. As understood, the conditioning process requires that some amount of surface porosity be created in order that the activation chemicals, typically a colloidal palladium solution, can be deposited in the pores created by this limited etching. It is thought that the caustic bath preferentially attacks the amorphous, as opposed to the crystalline or crystallite regions, of the polymeric film substrate.

Turning now to the Figures, FIG. 1A shows the variation in loss tangent on the 0.30 mil thick Apical film after 5, 10, 20 and 30 minutes in three different etch solutions. The solutions were 10% caustic with 20 grams/liter DEA (diethyl amine), 2.5% caustic with 20 grams/liter DEA, and 2.5% caustic with no DEA. The loss tangent is a complex number representing the relationship between the permeance and suseptance, expressed as the ratio of the imaginary to the real components of each. This is the number given by a measurement of a permeance meter. The electroless metal film tested is an alloy comprising Co greater than about 80%, Fe greater than about 10% and Ni of about 2–5%.

FIG. 2A shows the variation of loss tangent as a function of metal thickness on a 30 gage HN Kapton film.

Figure 3A:
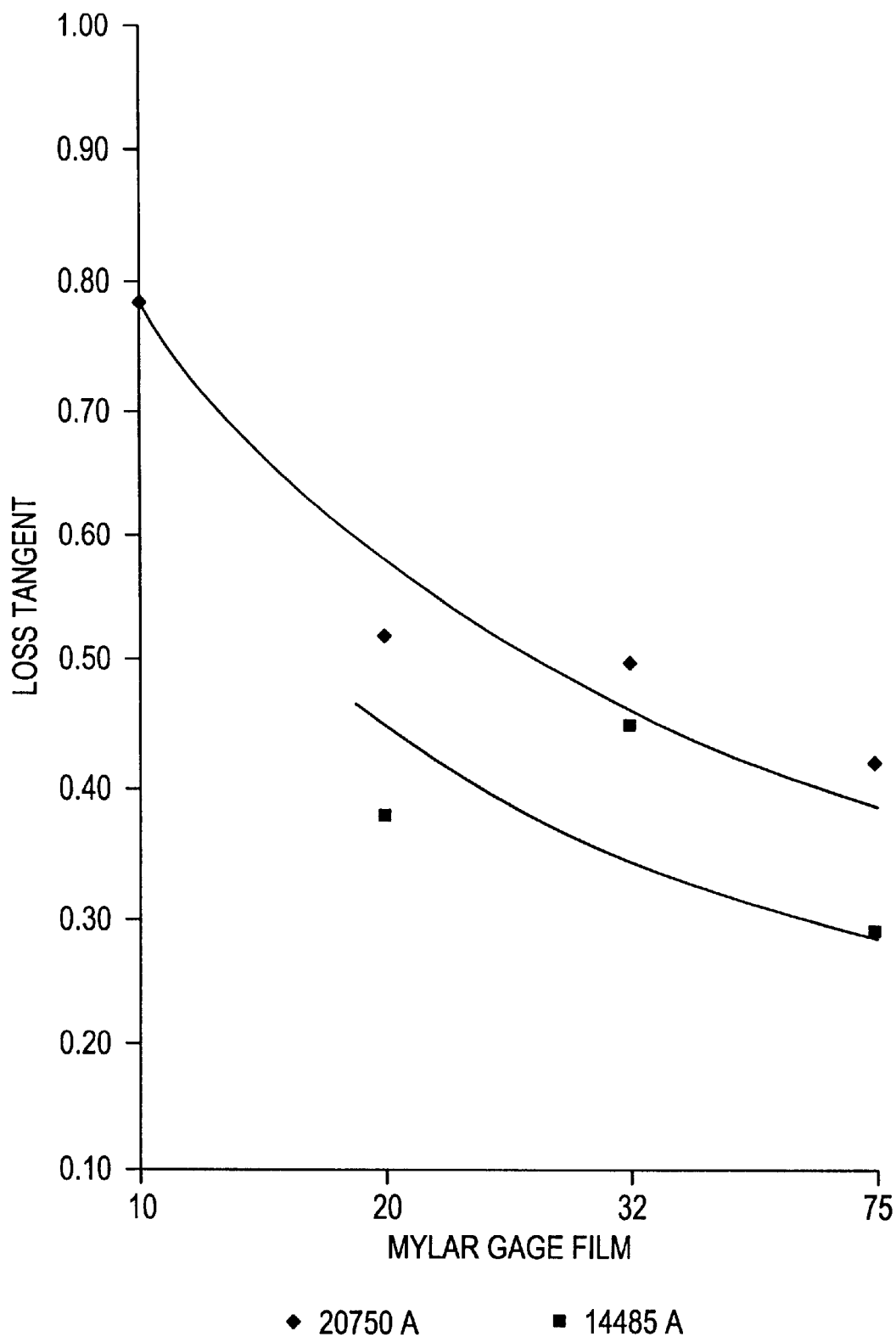
FIG. 3A is a graph showing the variation in loss tangent as a function of the gage of Mylar film for two different metallization thicknesses.

FIG. 3A shows the variation of loss tangent on 0.10, 0.20, 0.32 and 0.75 mil Mylar films for two different metal thicknesses, 20750 and 14485 angstroms.

A successful conditioning of the substrate is immediately apparent as the electroless plating process is carried out. Either the metal will not plate because the activation chemicals have not attached to the surface of the substrate to a sufficient extent, or, if the metal plates is insufficient adhesion, the metal will develop sufficient stress as it builds up thickness that it will curl and peel or flake off even while still in the electroless plating bath.

Although various embodiments of the present invention have been described in detail hereinabove, it should be clearly understood that many variations and/or modifications of the basic inventive concepts herein taught which may become apparent to those skilled in the pertinent art will still fall within the spirit and scope of the present invention as defined in the appended claims.

What is claimed is:

1. A process for conditioning polymeric films having a thickness of less than 1 mil prior to plating a metal thereupon by an electroless deposition process, the conditioning process comprising the step of:

etching sufficient porosity on the surface of the polymeric film for successful attachment of an activation chemical used in the electroless deposition process by contacting the surface with an aqueous solution comprising a metal hydroxide salt having a concentration of less than 2.5 wt % and said aqueous solution being free of organic solvents.

2. The process of claim 1 wherein the metal hydroxide salt is selected from NaOH and KOH.

3. The process of claim 1 wherein the concentration of the salt is about 1 wt %.

4. The process of claim 1 wherein the polymeric film is a polyimide film.

5. The process of claim 4 wherein the aqueous solution is at ambient temperature.

6. The process of claim 4 wherein the surface is contacted by the aqueous solution for less than about 60 minutes.

7. The process of claim 4 wherein the polyimide is a chemically cured film and the surface is contacted by the aqueous solution for about 20 minutes.

8. The process of claim 4 wherein the polyimide is a heat-cured film.

9. The process of claim 8 wherein the film is contacted with the aqueous solution for about 20 minutes, followed by a heated water rinse.

10. The process of claim 8 wherein the film is contacted with the aqueous solution for about 40–45 minutes, followed by an ambient temperature water rinse.

11. The process of claim 1 wherein the polymeric film is a polyester terephthalate film and the aqueous solution additionally comprises a permanganate salt.

12. The process of claim 11, wherein the aqueous solution comprises 50–60 g/liter of potassium permanganate and 200 g/liter of sodium hydroxide.

13. The process of claim 4 wherein the aqueous solution additionally comprises a diethylamine solution having a concentration of about 20 g/liter.

14. The process of claim 1, wherein the polymeric film is a polyester terephthalate film.

15. The process of claim 14, wherein the aqueous solution additionally comprises an oxidizer.

16. A process for conditioning polymeric films having a thickness of less than 1 mil prior to plating a metal thereupon by an electroless deposition process, the conditioning process comprising the step of:

etching sufficient porosity on the surface of the polymeric film for successful attachment of an activation chemical used in the electroless deposition process by contacting a surface of the polymeric film with a conditioning bath consisting of an aqueous solution having a metal hydroxide salt concentration therein of less than 2.5 wt %.

17. The process of claim 16, wherein the film is contacted with the aqueous solution for about 20 minutes, followed by a heated water rinse.

18. The process of claim 16, wherein the film is contacted with the aqueous solution for about 40–45 minutes, followed by an ambient temperature water rinse.

19. The process of claim 16, wherein the polymeric film is a polyimide film.

20. A process for conditioning polymeric films having a thickness of less than 1 mil prior to plating a metal thereupon by an electroless deposition process, the conditioning process comprising the steps of:

etching sufficient porosity on the surface of the polymeric film for successful attachment of an activation chemical used in the electroless deposition process by contacting a surface of the polymeric film with a conditioning bath comprising an aqueous solution having a metal hydroxide salt concentration in the range of about 1–2 wt % and said conditioning bath being free of organic solvents; and activating the etched surface of the polymeric film by depositing a colloidal palladium solution in pores created in the surface of the polymeric film by the etching step.

* * * * *